(12) United States Patent
Kokubun et al.

(10) Patent No.: US 10,964,834 B2
(45) Date of Patent: Mar. 30, 2021

(54) PHOTODETECTOR AND LIGHT DETECTION AND RANGING

(71) Applicants: Kabushiki Kaisha Toshiba, Minato-ku (JP); Toshiba Electronic Devices & Storage Corporation, Minato-ku (JP)

(72) Inventors: Koichi Kokubun, Yokohama (JP); Nobu Matsumoto, Ebina (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 66 days.

(21) Appl. No.: 16/130,285

(22) Filed: Sep. 13, 2018

(65) Prior Publication Data

US 2019/0296074 A1 Sep. 26, 2019

(30) Foreign Application Priority Data

Mar. 20, 2018 (JP) .............................. JP2018-053353

(51) Int. Cl.
*H01L 31/107* (2006.01)
*H01L 27/144* (2006.01)
(Continued)

(52) U.S. Cl.
CPC ........ *H01L 31/107* (2013.01); *H01L 27/1446* (2013.01); *H01L 27/1463* (2013.01);
(Continued)

(58) Field of Classification Search
CPC ............... H01L 31/107; H01L 27/1446; H01L 27/14609; H01L 27/1463; H01L 27/14649;
(Continued)

(56) References Cited

U.S. PATENT DOCUMENTS

| 4,321,611 A | 3/1982 | Conti |
| 6,392,282 B1 | 5/2002 | Sahara et al. |

(Continued)

FOREIGN PATENT DOCUMENTS

| JP | 11-45988 A | 2/1999 |
| JP | 11-46010 A | 2/1999 |

(Continued)

OTHER PUBLICATIONS

Summons dated Feb. 9, 2021, in European Patent Application No. 18 201 175.9.

*Primary Examiner* — Seung C Sohn
(74) *Attorney, Agent, or Firm* — Oblon, McClelland, Maier & Neustadt, L.L.P.

(57) ABSTRACT

A photodetector includes: a silicon layer of a first conductivity type; a first semiconductor layer that is provided in the silicon layer, of a first conductivity type, and having an impurity concentration higher than a carrier concentration of the silicon layer; a second semiconductor layer provided on the first semiconductor layer, of a second conductivity type, and forming a pn boundary with the first semiconductor layer; a third semiconductor layer provided in the silicon layer, of a first conductivity type, having an impurity concentration higher than that of the silicon layer, and separated from the first semiconductor layer; a first electrode connected to the silicon layer; and a second electrode connected to the second semiconductor layer.

13 Claims, 13 Drawing Sheets

(51) Int. Cl.
*H01L 27/146* (2006.01)
*H01L 49/02* (2006.01)
*H01L 31/02* (2006.01)
*H01L 31/0224* (2006.01)
*H01L 31/028* (2006.01)
*H01L 31/0352* (2006.01)
*H01L 31/103* (2006.01)

(52) U.S. Cl.
CPC .. *H01L 27/14609* (2013.01); *H01L 27/14649* (2013.01); *H01L 28/20* (2013.01); *H01L 31/028* (2013.01); *H01L 31/02027* (2013.01); *H01L 31/022408* (2013.01); *H01L 31/03529* (2013.01); *H01L 31/035281* (2013.01); *H01L 31/103* (2013.01); *H01L 31/022475* (2013.01)

(58) Field of Classification Search
CPC ............... H01L 28/20; H01L 31/02027; H01L 31/022408; H01L 31/028; H01L 31/035281; H01L 31/03529; H01L 31/103; H01L 31/022475; H01L 25/042; G01S 17/08
USPC ..................................................... 250/208.1
See application file for complete search history.

(56) References Cited

U.S. PATENT DOCUMENTS

| | | | |
|---|---|---|---|
| 7,262,402 B2 * | 8/2007 | Niclass | ............. H01L 27/14647 250/208.1 |
| 8,259,293 B2 * | 9/2012 | Andreou | ............... H01L 31/107 356/222 |
| 8,884,213 B2 * | 11/2014 | Grazioso | ................. G01T 1/202 250/252.1 |
| 9,257,589 B2 | 2/2016 | Niclass et al. | |
| 10,446,601 B2 | 10/2019 | Otake et al. | |
| 10,580,817 B2 | 3/2020 | Otake et al. | |
| 10,804,309 B2 | 10/2020 | Otake et al. | |
| 2015/0054111 A1 | 2/2015 | Niclass et al. | |
| 2015/0333095 A1 * | 11/2015 | Fallica | ............. H01L 27/14643 250/208.1 |
| 2017/0031010 A1 | 2/2017 | Suzuki et al. | |
| 2017/0263798 A1 | 9/2017 | Suzuki et al. | |

FOREIGN PATENT DOCUMENTS

| | | |
|---|---|---|
| JP | 2017-33962 | 2/2017 |
| JP | 6090060 | 2/2017 |
| JP | 2017-163046 | 9/2017 |
| JP | 2018-201005 | 12/2018 |

* cited by examiner

PHOTODETECTOR AND LIGHT DETECTION AND RANGING

CROSS-REFERENCE TO RELATED APPLICATIONS

This application is based upon and claims the benefit of priority from Japanese Patent Application No. 2018-053353, filed Mar. 20, 2018, the entire contents of which are incorporated herein by reference.

FIELD

Embodiments relate to a photodetector and a light detection and ranging.

BACKGROUND

In recent years, as one of devices for realizing automatic driving, an in-vehicle light detection and ranging (LIDAR) has been developed. An in-vehicle LIDAR is configured to include a laser oscillator that oscillates an infrared laser, a scanning optical system that scans an infrared laser, a photodetector that detects infrared light reflected from a target, a control circuit, and the like. As a result, it is possible to identify a shape of or a distance from a faraway target. As a photodetector, a silicon photomultiplier (SiPM) can be used.

DETAILED DESCRIPTION

Embodiments include a photodetector. Applicants recognized that in a photodetector, for example a SiPM used in a LIDAR, silicon has a low infrared absorption rate, and thereby it is desirable to improve photon detection efficiency (PDE) in the SiPM.

The photodetector includes: a silicon layer of a first conductivity type; a first semiconductor layer provided in the silicon layer, of a first conductivity type, and having an impurity concentration higher than a carrier concentration of the silicon layer; a second semiconductor layer provided on the first semiconductor layer, of a second conductivity type, and forming a pn boundary with the first semiconductor layer; a third semiconductor layer provided in the silicon layer, of a first conductivity type, having an impurity concentration higher than that of the silicon layer, and separated from the first semiconductor layer; a first electrode connected to the silicon layer; and a second electrode connected to the second semiconductor layer.

First Embodiment

A first embodiment will be described.

Figure 1:
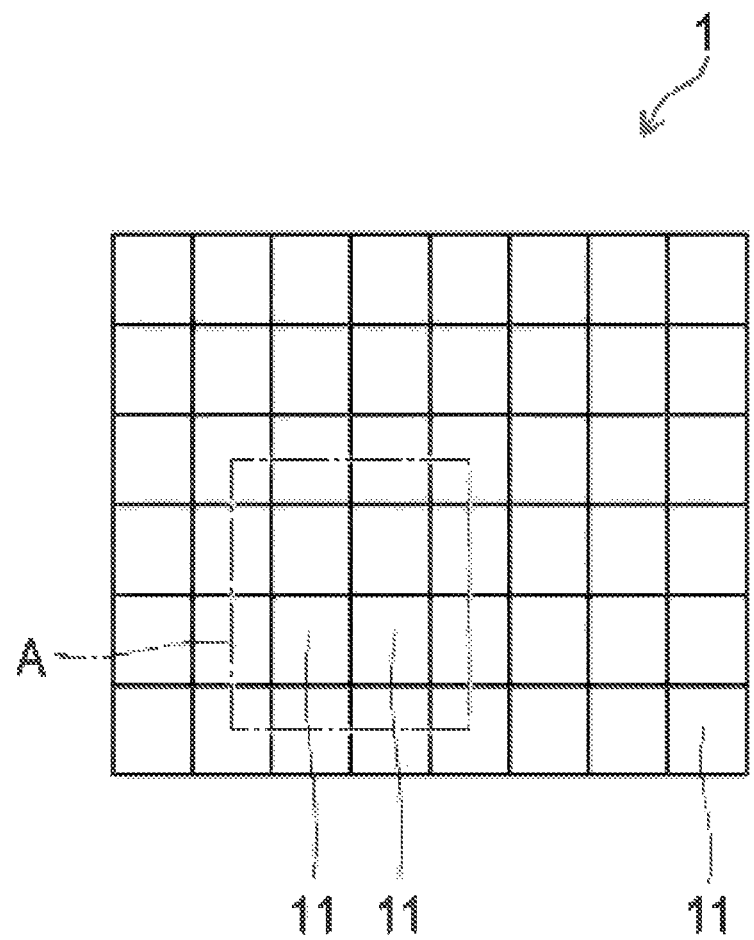
FIG. 1 is a plan view showing a photodetector according to a first embodiment.

FIG. 1 is a plan view showing a photodetector according to the first embodiment.

Figure 2:
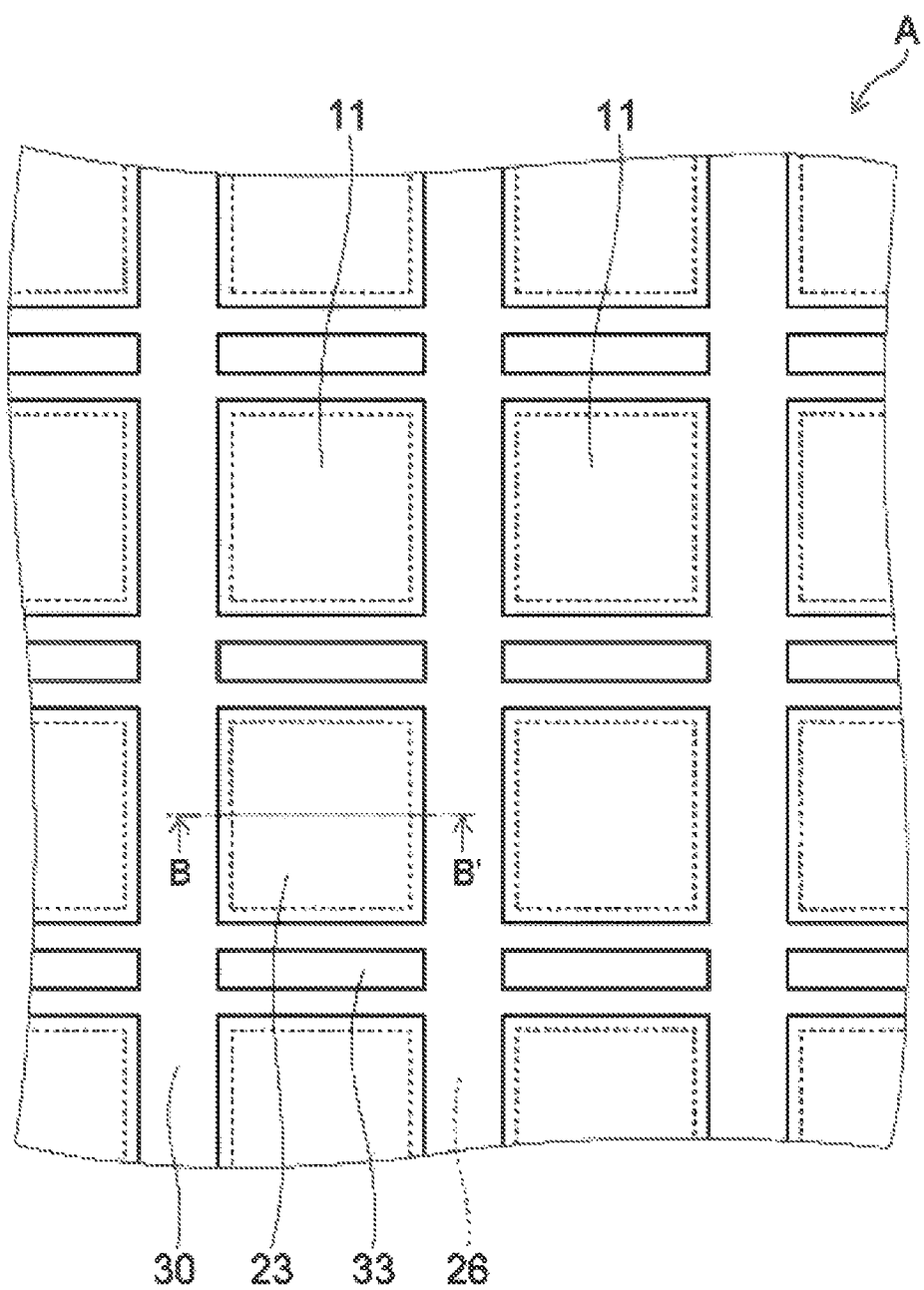
FIG. 2 is a plan view showing a region A of FIG. 1.

FIG. 2 is a plan view showing a region A of FIG. 1.

Figure 3:
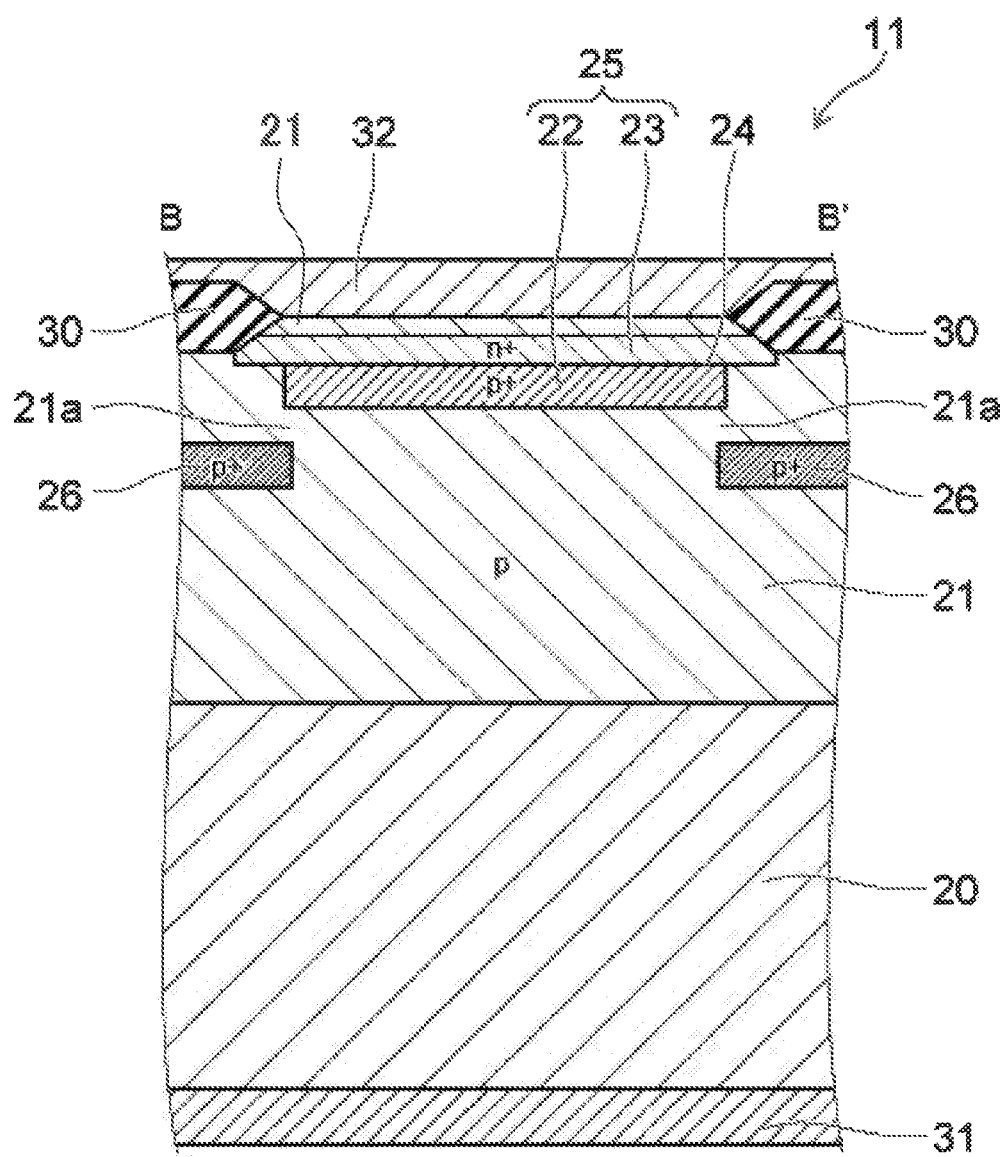
FIG. 3 is a cross-sectional view taken along line B-B' shown in FIG. 2.

FIG. 3 is a cross-sectional view taken along line B-B' shown in FIG. 2.

Figure 4:
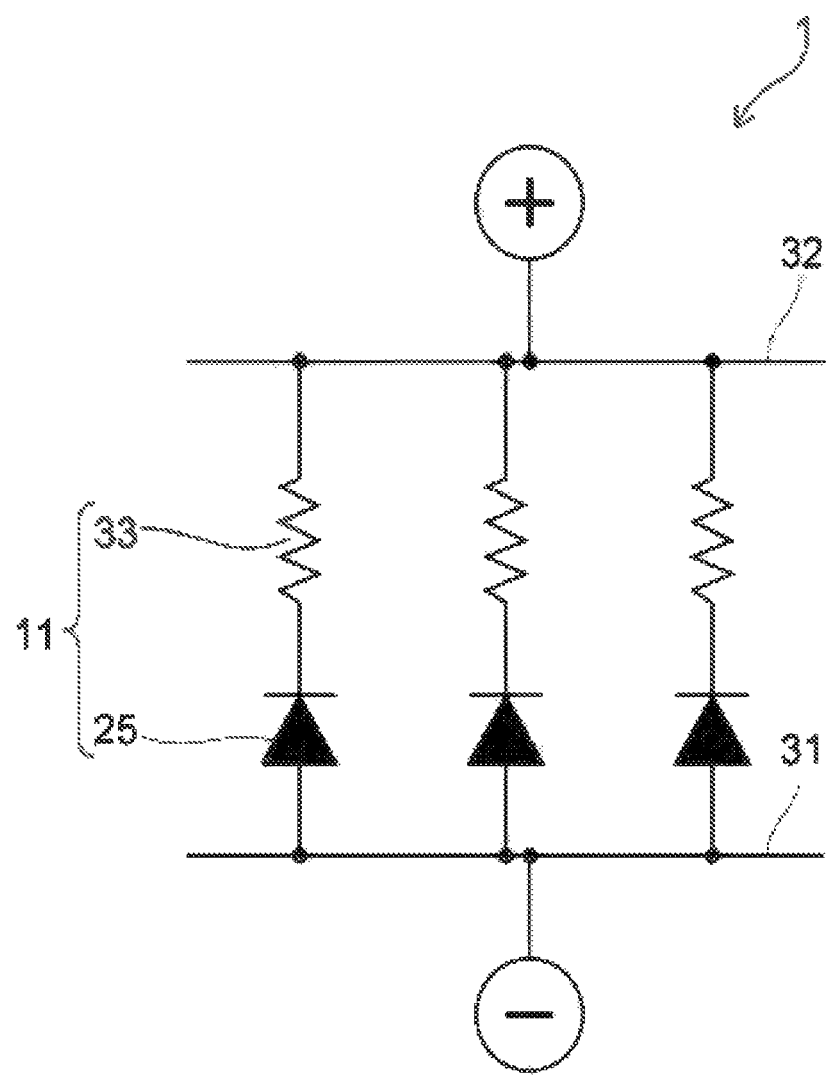
FIG. 4 is a circuit diagram showing the photodetector according to the first embodiment.

FIG. 4 is a circuit diagram showing the photodetector according to the first embodiment.

Each figure is a schematically shown, and each constituent element is simplified or omitted as appropriate. The same applies for figures to be described later.

As shown in FIG. 1, in a photodetector 1 according to the first embodiment, a plurality of SiPM elements 11 are arranged in a matrix form. In the photodetector 1, for example, 48 SiPM elements 11 are arranged in 6 rows and 8 columns. The photodetector 1 is formed by a semiconductor process.

As shown in FIGS. 2 and 3, in the photodetector 1, a silicon substrate 20 is provided. The silicon substrate 20 is formed of, for example, single crystal silicon (Si). An epitaxial layer 21 formed of silicon is provided on the silicon substrate 20. The epitaxial layer 21 is formed by epitaxially growing silicon on an upper surface of the silicon substrate 20 as a starting point, and a conductivity type is a p type.

For example, a local oxidation of silicon (LOCOS) film, shallow trench isolation (STI), or deep trench isolation (DTI) 30 is provided on a part of the epitaxial layer 21. Hereinafter, for the sake of brevity of description, they are collectively referred to as a "LOCOS film 30". When viewed from above, that is, when viewed from a direction from the silicon substrate 20 toward the epitaxial layer 21, a shape of the LOCOS film 30 has a lattice shape. Each SiPM element 11 is formed in each region partitioned by the lattice-shaped LOCOS film 30.

In each SiPM element 11, a p+ type layer 22 is provided in an upper layer part of the epitaxial layer 21. A conductivity type of the p+ type layer 22 is a p type, and a concentration of impurities as a carrier (hereinafter, also referred to simply as "impurity concentration") is higher than that of the epitaxial layer 21. The impurity concentration of the p+ type layer 22 is equal to or higher than $4.5 \times 10^{16}$ cm$^{-3}$, for example.

An n+ type layer 23 is provided on the p+ type layer 22. A conductivity type of the n+ type layer 23 is an n type. The n+ type layer 23 is in contact with the p+ type layer 22 to form a pn boundary 24. The impurity concentration of the n+ type layer 23 is equal to or higher than $1 \times 10^{18}$ cm$^{-3}$, for example. A diode 25 is formed by the p+ type layer 22 and the n+ type layer 23. When viewed from above, an outer edge of the n+ type layer 23 is located outside of an outer edge of the p+ type layer 22. The p+ type layer 22 and the n+ type layer 23 are provided for each SiPM element 11, and are separated from a p+ type layer 22 and an n+ type layer 23 of the adjacent SiPM elements 11 by the LOCOS film 30.

In the epitaxial layer 21, a peripheral p+ type layer 26 is provided in a region including a region directly under the LOCOS film 30. When viewed from above, a shape of the peripheral p+ type layer 26 is the same as that of the LOCOS film 30, or a lattice shape which is bigger (extends further in the horizontal direction of FIG. 3) than the LOCOS film 30. The conductivity type of the peripheral p+ type layer 26 is a p type, and an impurity concentration of the peripheral p+ type layer 26 is higher than that of the epitaxial layer 21. For example, the impurity concentration of the peripheral p+ type layer 26 is at least 10 times higher than that of the epitaxial layer 21. For example, the impurity concentration of the epitaxial layer 21 is $1 \times 10^{13}$ to $1 \times 10^{16}$ cm$^{-3}$, for example, $3 \times 10^{15}$ cm$^{-3}$ or lower, and for example the impurity concentration of the peripheral p+ type layer 26 is $1 \times 10^{15}$ cm$^{-3}$ or higher.

The peripheral p+ type layer 26 is disposed between the p+ type layer 22 and the silicon substrate 20, and is separated from the p+ type layer 22. A portion 21a of the epitaxial layer 21 is interposed between the peripheral p+ type layer 26 and the p+ type layer 22. Since impurities are diffused from the peripheral p+ type layer 26 and the p+ type layer 22 to the portion 21a, an impurity concentration of the portion 21a is higher than the average impurity concentration of the epitaxial layer 21, but is lower than half of the impurity concentration of the peripheral p+ type layer 26. Also, when viewed from above, the peripheral p+ type layer 26 surrounds the p+ type layer 22, but an end portion of the peripheral p+ type layer 26 may overlap with an end portion of the p+ type layer 22. A width of the overlapping portion is, for example, 0 to 1 μm. In addition, when the peripheral p+ type layer 26 surrounds the p+ type layer 22, an interval between the peripheral p+ type layer 26 and the p+ type layer 22 is, for example, 0 to 1 μm.

An electrode film 31 is provided on a lower surface of the silicon substrate 20. The electrode film 31 is formed of, for example, a metal material. An upper surface of the electrode film 31 is in contact with the lower surface of the silicon substrate 20. Therefore, the electrode film 31 is connected to the epitaxial layer 21 via the silicon substrate 20.

An electrode film 32 is provided on an upper surface of the epitaxial layer 21. The electrode film 32 is formed of, for example, conductive transparent materials such as indium-tin-oxide (ITO: tin-doped indium oxide). A lower surface of the electrode film 32 is in contact with the upper surface of the epitaxial layer 21. Therefore, the electrode film 32 is connected to the n+ type layer 23 via the uppermost layer portion of the epitaxial layer 21. The electrode film 32 is patterned in a predetermined shape. Further, as shown in FIG. 4, a resistance element 33 which is formed of, for example, polysilicon is provided on the LOCOS film 30. The resistance element 33 is connected to the electrode film 32.

As a result, as shown in FIG. 4, in the photodetector 1, the plurality of SiPM elements 11 are connected in parallel between the electrode film 31 and the electrode film 32. In each SiPM element 11, the diode 25 and the resistance element 33 are connected in series.

Next, an operation of the photodetector according to the first embodiment will be described.

Figure 5:
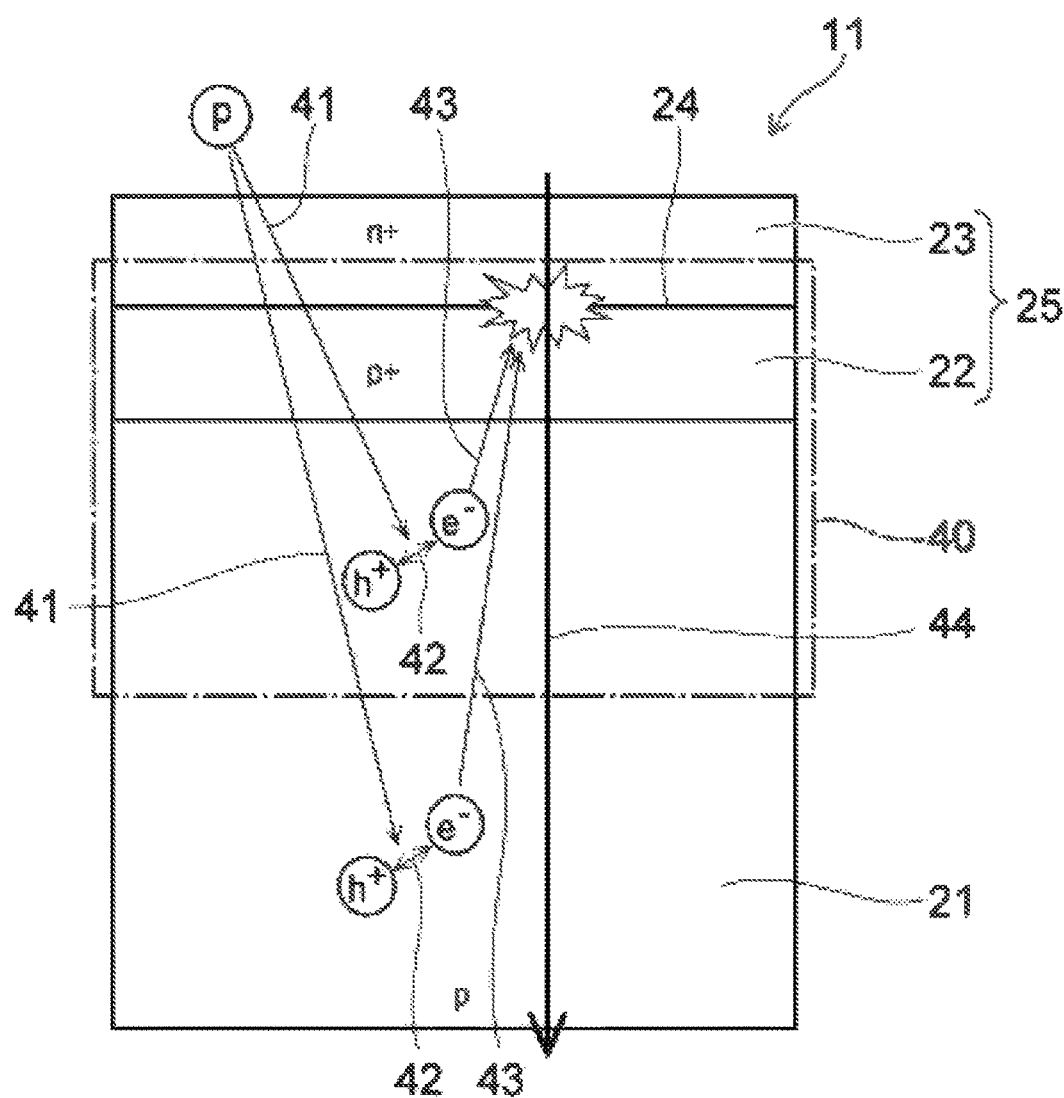
FIG. 5 is a diagram showing an operation of the photodetector according to the first embodiment.

FIG. 5 is a diagram showing the operation of the photodetector according to the first embodiment.

Figure 6:
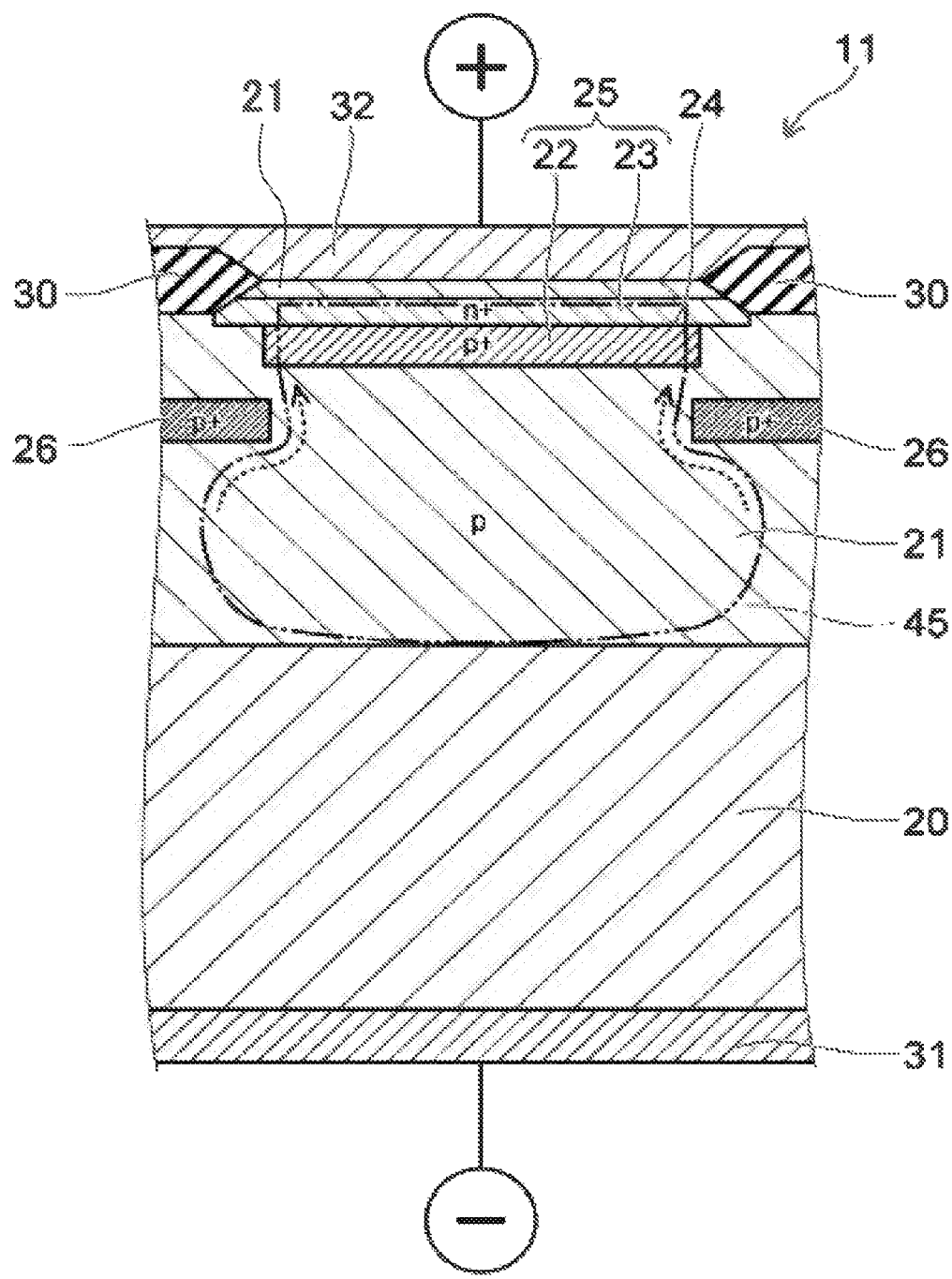
FIG. 6 is a diagram showing an effective region of the photodetector according to the first embodiment.

FIG. 6 is a diagram showing an effective region of the photodetector according to the first embodiment.

Figure 7:
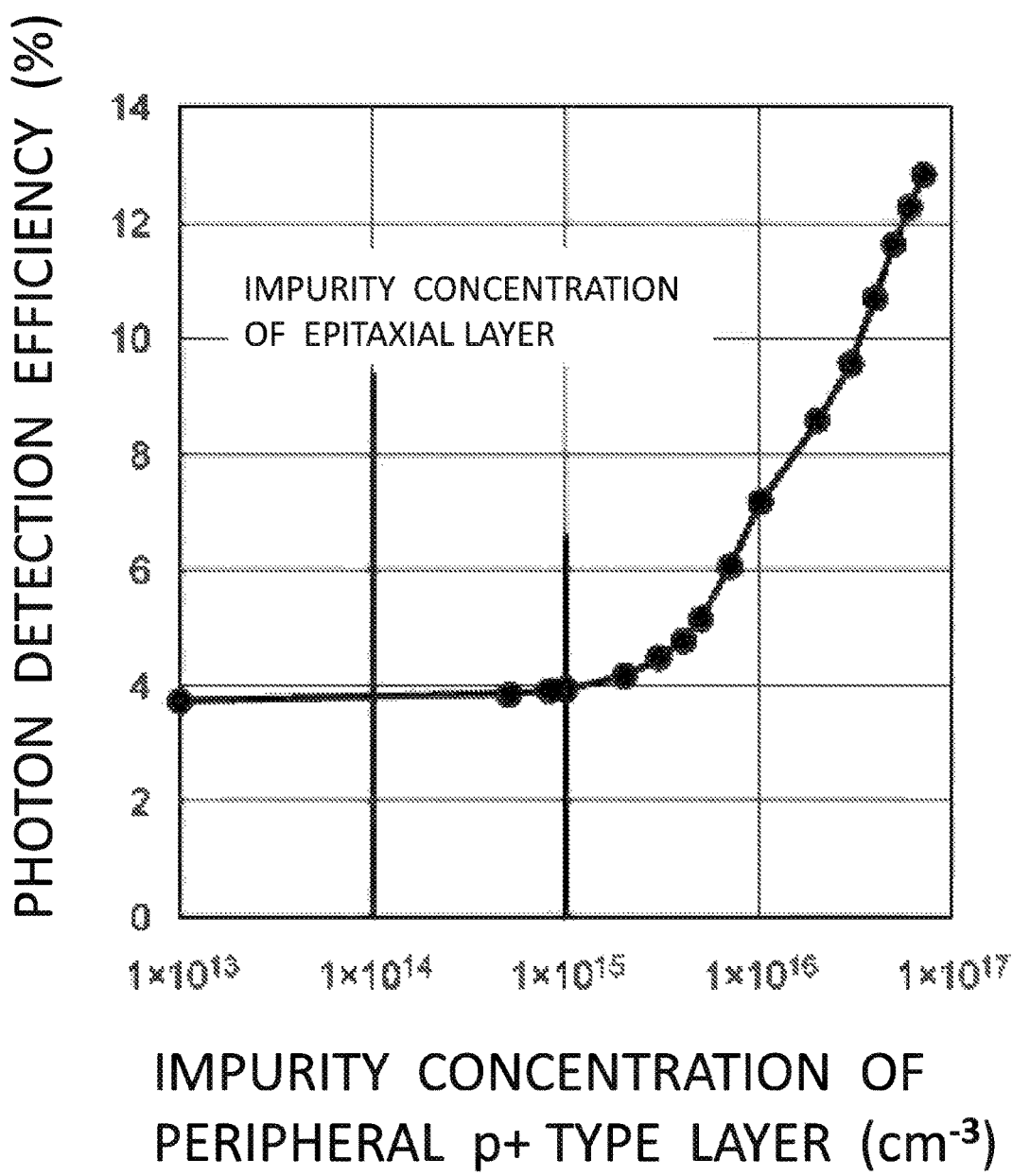
FIG. 7 is a graph showing an influence of an impurity concentration of a peripheral p+ type layer on photon detection efficiency (PDE) by taking the impurity concentration of the peripheral p+ type layer on a horizontal axis and the photon detection efficiency on a vertical axis.

FIG. 7 is a graph showing an influence of an impurity concentration of a peripheral p+ type layer on photon detection efficiency (PDE) by taking the impurity concentration of the peripheral p+ type layer on a horizontal axis and the photon detection efficiency on a vertical axis.

As shown in FIGS. 5 and 6, a voltage is applied between the electrode film 31 and the electrode film 32 so that the electrode film 31 becomes a negative electrode and the electrode film 32 becomes a positive electrode. As a result, a depletion layer 40 is vertically diffused from the pn boundary 24 as a starting point. The depletion layer 40 reaches the insides of the n+ type layer 23 and the epitaxial layer 21. As a result, a parasitic capacitor sandwiching the depletion layer 40 is formed, and thus electric charges are accumulated.

In this state, as shown by an arrow 41 in FIG. 5, infrared photons p are incident on a certain SiPM element 11. As a result, as shown by an arrow 42, pairs of electrons e− and holes h+ are generated in the epitaxial layer 21. A generation location of the pairs may be within the depletion layer 40 or may be outside the depletion layer 40. Of the pairs of electrons e− and holes h+ generated in the depletion layer 40, the electrons e− proceed toward the electrode film 32 by an electric field produced by the electrode film 31 and the electrode film 32 to reach the pn boundary 24, as shown by an arrow 43. On the other hand, of the pairs of electrons e− and holes h+ generated outside the depletion layer 40, the electrons e− move to the inside of the depletion layer 40 by the diffusion and then move by the electric field to reach the pn boundary 24. As a result, an avalanche breakdown occurs at the pn boundary 24, the diode 25 is in a conduction state, and as shown by an arrow 44, the electric charges accumulated in the parasitic capacitor are conducted between the electrode film 31 and the electrode film 32. As an electric charge flows, a voltage drop occurs across the resistance element 33, and the diode 25 returns to a non-conduction state again. By detecting a current flowing at this time, an incidence of photons p is detected.

Since each SiPM element 11 reacts to one photon p to make an avalanche current flow, one photon p can be detected. The SiPM element 11 in which the avalanche current has flowed cannot be basically used until it is recharged, but the avalanche current does not affect the peripheral SiPM elements 11. Since a plurality of, for example, 48 SiPM elements 11 is provided in the photodetector 1, it is possible to continuously detect, a plurality of photons at a time.

Since each SiPM element 11 cannot detect an incident angle of infrared light, the photodetector 1 itself has no spatial resolution. However, for example, one-dimensional spatial resolution can be realized by arranging a plurality of photodetectors 1 in a row and providing an appropriate optical system. Further, by scanning an infrared laser with a scanning optical system (not shown), two-dimensional spatial resolution can be realized. Furthermore, three-dimensional spatial resolution can be realized by measuring a time difference between the oscillation of the infrared laser and the detection of the infrared laser. It is possible to realize the two-dimensional spatial resolution by arranging the plurality of photodetectors 1 two-dimensionally and realize the three-dimensional spatial resolution by measuring the time difference.

As shown in FIG. 6, in the photodetector 1 according to the first embodiment, since the peripheral p+ type layer 26 is provided, an effective region 45 capable of capturing the photons p is increased. The effective region 45 is a location in which the photons p collide with silicon atoms to generate pairs of electrons e– and holes h+, and is a set of locations in which the generated electrons e– reach the pn boundary 24 to cause avalanche breakdown. Even if the photons p generate pairs of electrons e– and holes h+ at the outside of the effective region 45, the generated electrons e– do not reach the pn boundary 24, so that the avalanche breakdown does not occur and the photons p are not detected. Therefore, the larger the effective region 45 in each SiPM element 11, the higher the photon detection efficiency (PDE).

The reason why the effective region 45 is increased due to the provision of the peripheral p+ type layer 26 is as follows.

First, since the peripheral p+ type layer 26 acts as a barrier against electrons e–, the electrons e– will flow around the peripheral p+ type layer 26 and more easily reach the pn boundary 24 in which avalanche breakdown occurs.

Second, since the peripheral p+ type layer 26 suppresses the extension of the depletion layer 40, the depletion layer 40 becomes smaller in the region directly under the LOCOS film 30, that is, in the peripheral part of the SiPM element 11, and the electrons e– are less likely to be moved to the peripheral part of the SiPM element 11 via the depletion layer 40.

Third, due to the concentration difference of holes between the epitaxial layer 21 and the peripheral p+ type layer 26, the electric field is generated from the epitaxial layer 21 toward the peripheral p+ type layer 26, so that lines of electric force passing through the pn boundary 24 are diffused outward. Since the electrons e– flow along the lines of electric force, if the lines of electric force passing through the pn boundary 24 are diffused outward, electrons generated in the peripheral part of the SiPM element 11 more easily reach the pn boundary 24.

In addition, in the first embodiment, the impurity concentration of the peripheral p+ type layer 26 is set to be at least 10 times higher than that of the epitaxial layer 21, so that the above-described effect can be reliably obtained.

As shown in FIG. 7, as a result of a simulation, when the impurity concentration of the epitaxial layer 21 was $1 \times 10^{14}$ cm$^{-3}$, if the impurity concentration of the peripheral p+ type layer 26 was $1 \times 10^{15}$ cm$^{-3}$ or higher, that is, at least 10 times higher than the impurity concentration of the epitaxial layer 21, the photon detection efficiency was remarkably improved.

Next, the effects of the first embodiment will be described.

According to the first embodiment, by providing the peripheral p+ type layer 26 in the epitaxial layer 21 in the peripheral portion of the SiPM element 11, it is possible to increase the effective region 45 capable of capturing the photons p, thereby improving the photon detection efficiency. In particular, when viewed from above, the end portion of the peripheral p+ type layer 26 overlaps with the end portion of the p+ type layer 22 or the end portion of the peripheral p+ type layer 26 is close to the end portion of the p+ type layer 22, so that electrons can be efficiently guided to the pn boundary 24. As a result, it is possible to realize the photodetector having the high photon detection efficiency on the whole by increasing the photon detection efficiency of each SiPM element 11.

Further, in the case of generating pairs of electrons e– and holes h+ by shortening the extending distance of the depletion layer 40 and making some of photons p collide with silicon atoms at the outside of the depletion layer 40, the electrons e– move within the epitaxial layer 21 by the diffusion. In this case, the effect of changing the flow of electrons by the peripheral p+ type layer 26 becomes gentle and the control becomes easier.

Modification of First Embodiment

Next, a modification of the first embodiment will be described.

Figure 8:
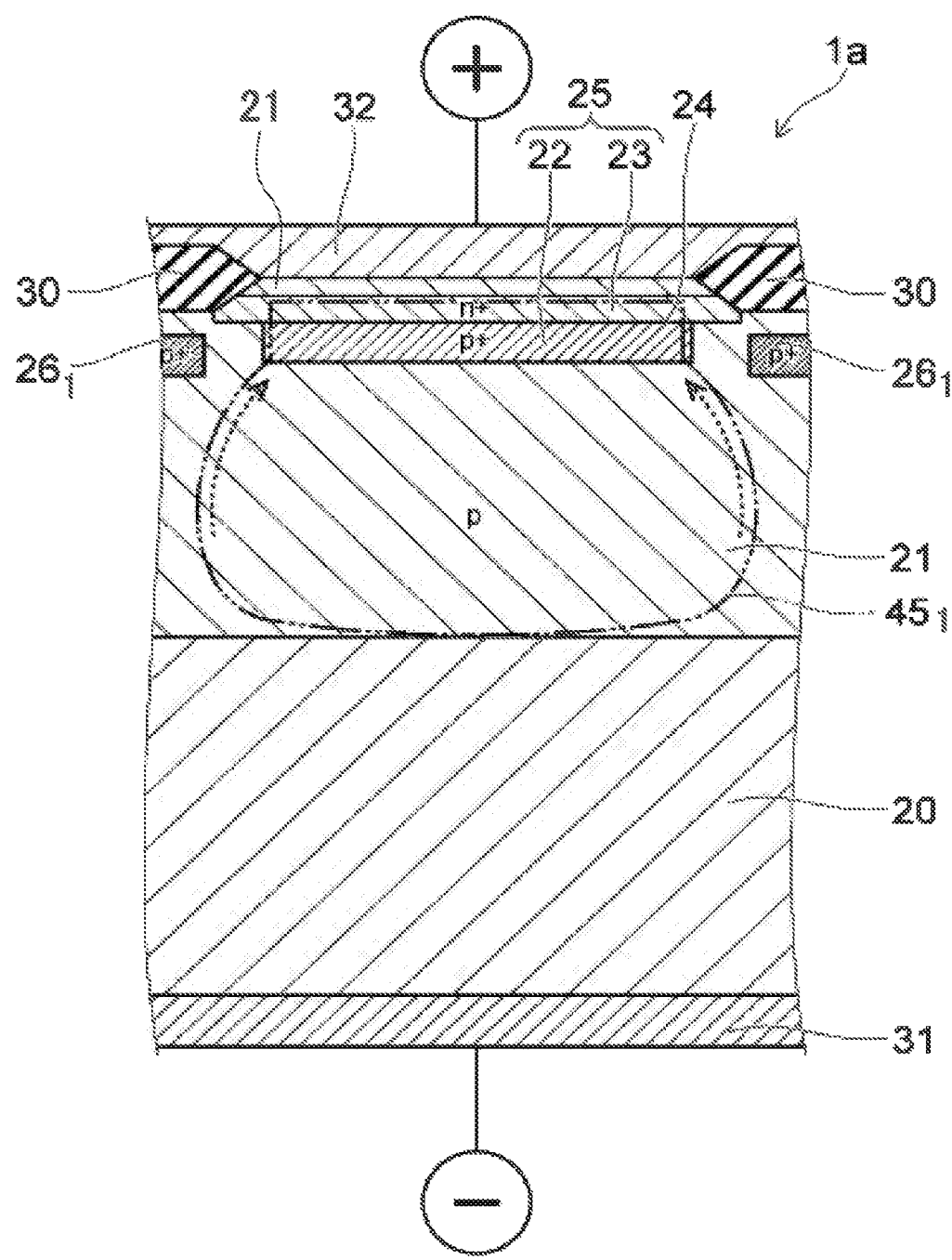
FIG. 8 is a cross-sectional view showing a photodetector according to a modification of the first embodiment.

FIG. 8 is a cross-sectional view showing a photodetector according to the present modification.

As shown in FIG. 8, in a photodetector 1a according to the present embodiment, a peripheral p+ type layer $26_1$ is located at substantially the same depth as the p+ type layer 22. The peripheral p+ type layer $26_1$ is separated from the p+ type layer 22. An impurity concentration of the peripheral p+ type layer $26_1$ is at least 10 times higher than that of an epitaxial layer 21.

Even by the present modification, similarly to the above-described first embodiment (see FIG. 6), it is possible to improve photon detection efficiency by increasing an effective region $45_1$ in which photons p can be captured.

Configurations, operations and effects other than those described above in the present modification are the same as those in the first embodiment.

Comparative Example

Next, a comparative example will be described.

Figure 9:
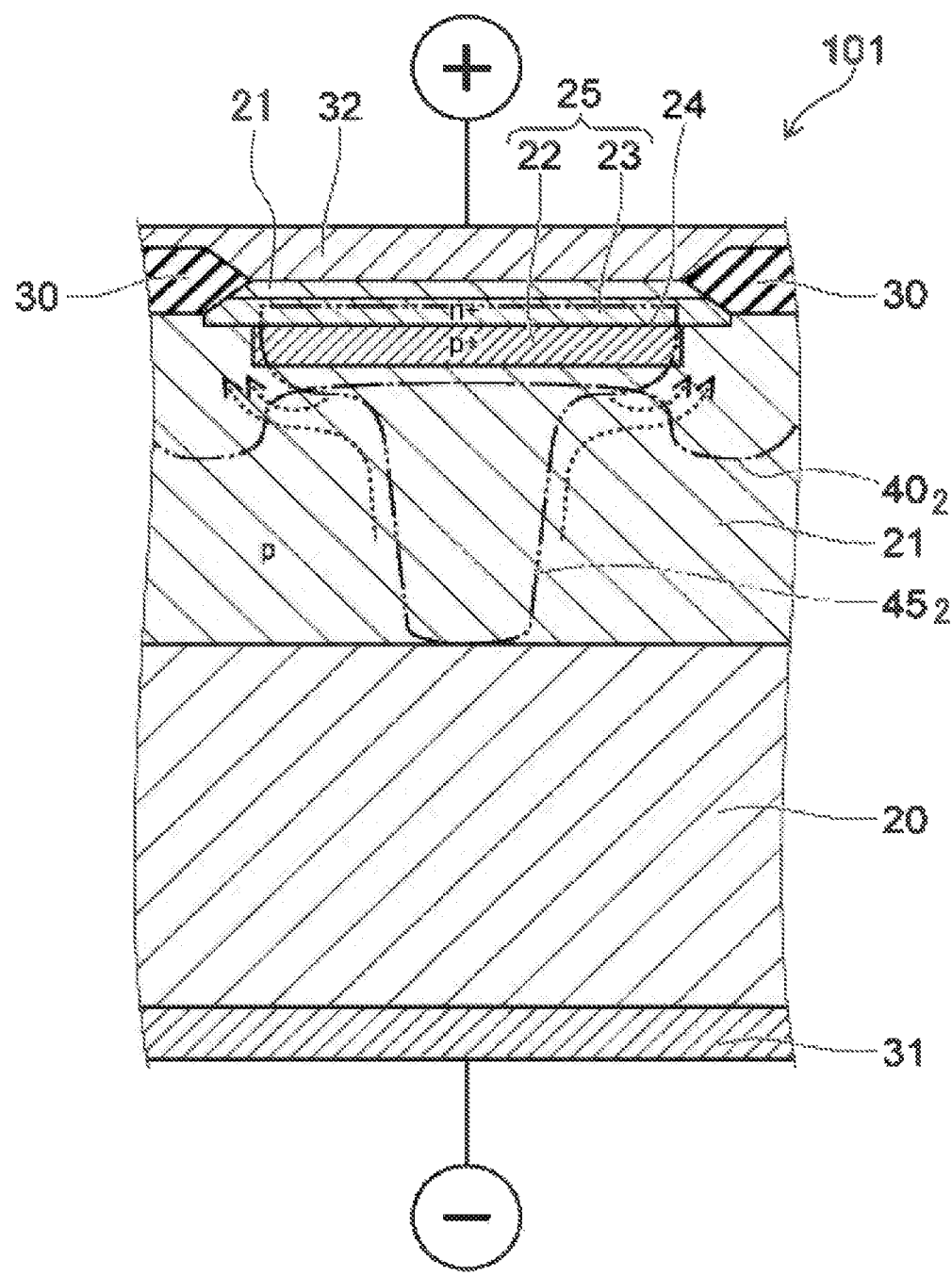
FIG. 9 is a cross-sectional view showing a photodetector according to a comparative example.

FIG. 9 is a cross-sectional view showing a photodetector according to the present comparative example.

As shown in FIG. 9, in a photodetector 101 according to the present comparative example, the peripheral p+ type layer 26 (see FIG. 3) is not provided. Therefore, the effective region $45_2$ is smaller and photon detection efficiency is decreased. This result is believed to arise because a depletion layer $40_2$ extends more downward in the peripheral portion than in a central part of an SiPM element 11, such that a flow is generated as if electrons are attracted to the depletion layer $40_2$ and thus the electrons flow into the periphery. The shapes of the effective region 45 and the depletion layer $40_2$ shown in FIGS. 6 and 9 trace simulation results. The same goes for figures to be described later.

Second Embodiment

Next, a second embodiment will be described.

Figure 10:
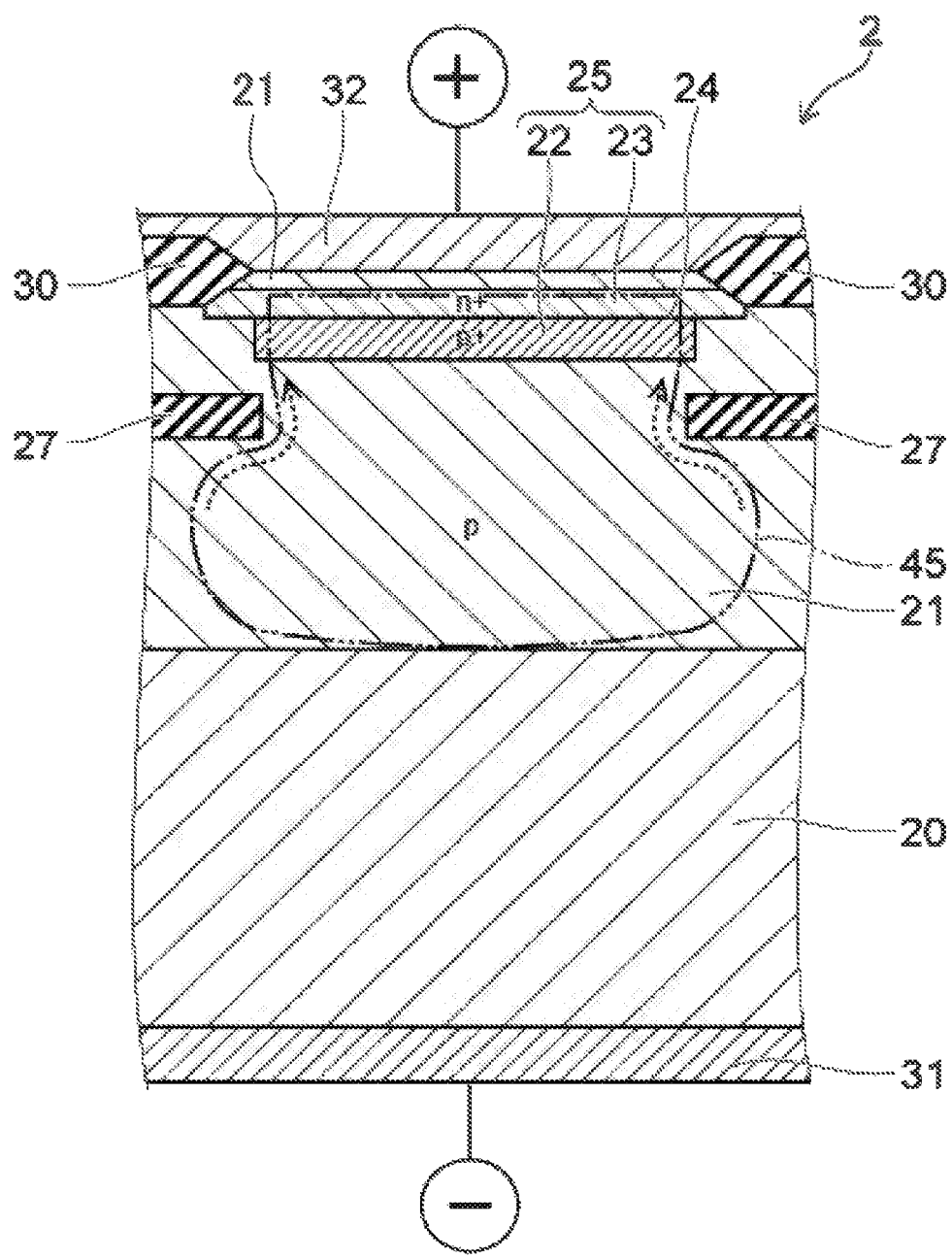
FIG. 10 is a cross-sectional view showing a photodetector according to a second embodiment.

FIG. 10 is a cross-sectional view showing a photodetector according to a second embodiment.

As shown in FIG. 10, the photodetector 2 according to the second embodiment is different from the photodetector 1 (see FIG. 3) according to the first embodiment described above in that instead of the peripheral p+ type layer 26, a peripheral insulating layer 27 is provided. The peripheral insulating layer 21 is formed of, for example, silicon oxide (SiO), and a shape thereof when viewed from above is the same as that of the LOCOS film 30 or a lattice shape which is thicker than the LOCOS film 30. In addition, the peripheral insulating layer 27 is disposed under the LOCOS film 30 and a p+ type layer 22, and thus is separated from the LOCOS film 30 and the p+ type layer 22.

Even in the second embodiment, an effective region 45 can be enlarged by allowing the peripheral insulating layer 27 to prevent electrons from moving and prevent a depletion layer 40 (see FIG. 5) from extending. As a result, the photodetector 2 has high photon detection efficiency.

Configurations, operations and effects other than those described above in the second embodiment are the same as those in the first embodiment.

Third Embodiment

Next, a third embodiment will be described.

Figure 11:
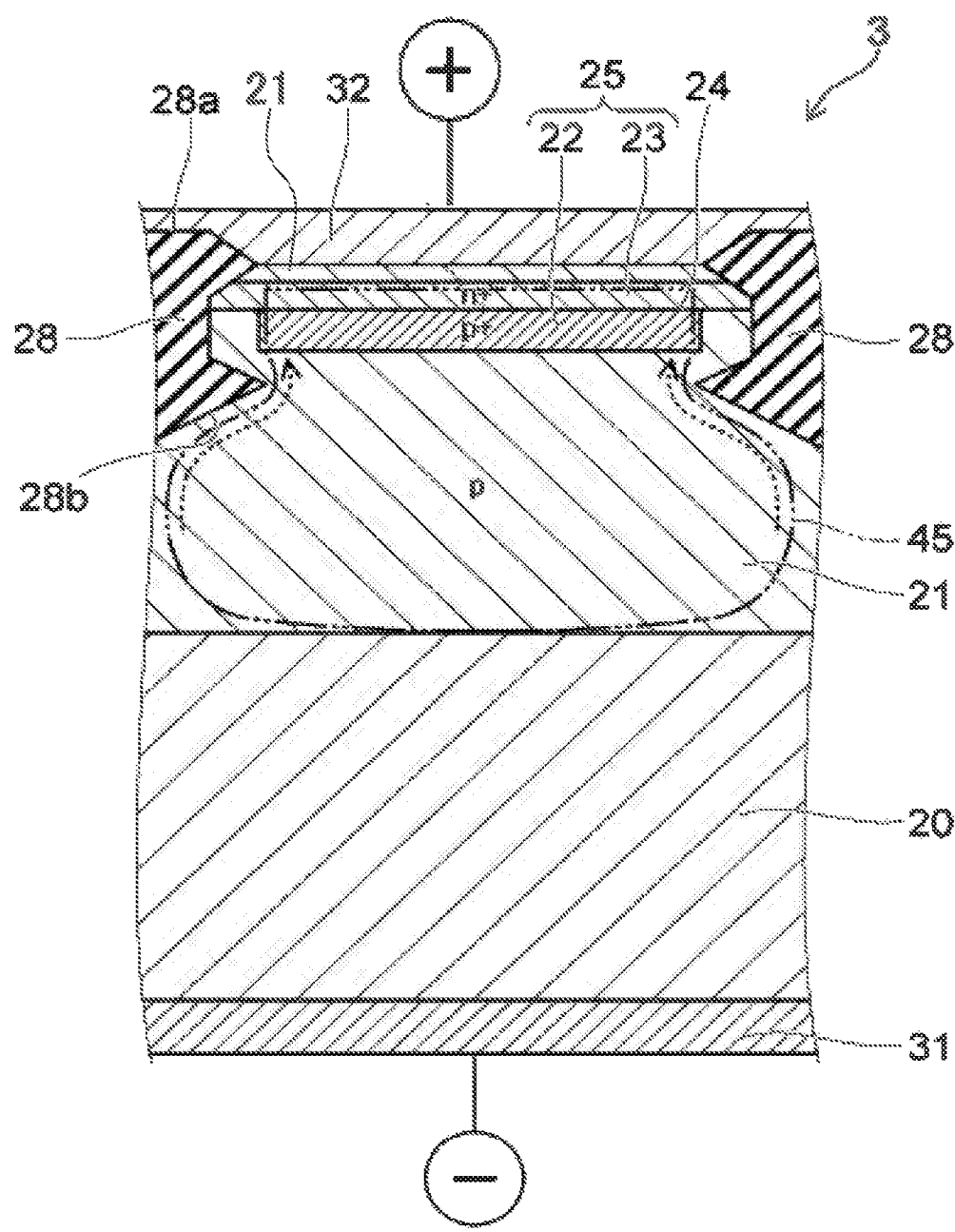
FIG. 11 is a cross-sectional view showing a photodetector according to a third embodiment.

FIG. 11 is a cross-sectional view showing a photodetector according to a third embodiment.

As shown in FIG. 11, a photodetector 3 according to the third embodiment is different from the photodetector 2 (see FIG. 10) according to the second embodiment described above in that instead of the LOCOS film 30 and the peripheral insulating layer 27, a peripheral insulating member 28 is provided.

The peripheral insulating member 28 is formed of, for example, silicon oxide. When viewed from above, a shape of the peripheral insulating member 28 has a lattice shape, and an SiPM element 11 is formed in a region surrounded by the peripheral insulating member 28. The peripheral insulating member 28 is separated from the p+ type layer 22. An end portion of the peripheral insulating member 28 disposed under the p+ type layer 22 can overlap with an end portion of the p+ type layer 22 when viewed from above. An upper surface 28a of the peripheral insulating member 28 is located higher than an upper surface of the epitaxial layer 21, and a lower surface 28b thereof is inclined and protruded to be higher toward inside the SiPM element 11, that is, a region directly under a central part of the p+ type layer 22.

According to the third embodiment, the lower surface 28b of the peripheral insulating member 28 is inclined to be higher toward the inside of the SiPM element 11, so that the flow of electrons can be guided to be toward a pn boundary 24. As a result, an effective region 45 is further enlarged, and thus the photon detection efficiency is further improved.

Configurations, operations and effects other than those described above in the third embodiment are the same as those in the second embodiment.

Fourth Embodiment

Next, a fourth embodiment will be described.

Figure 12:
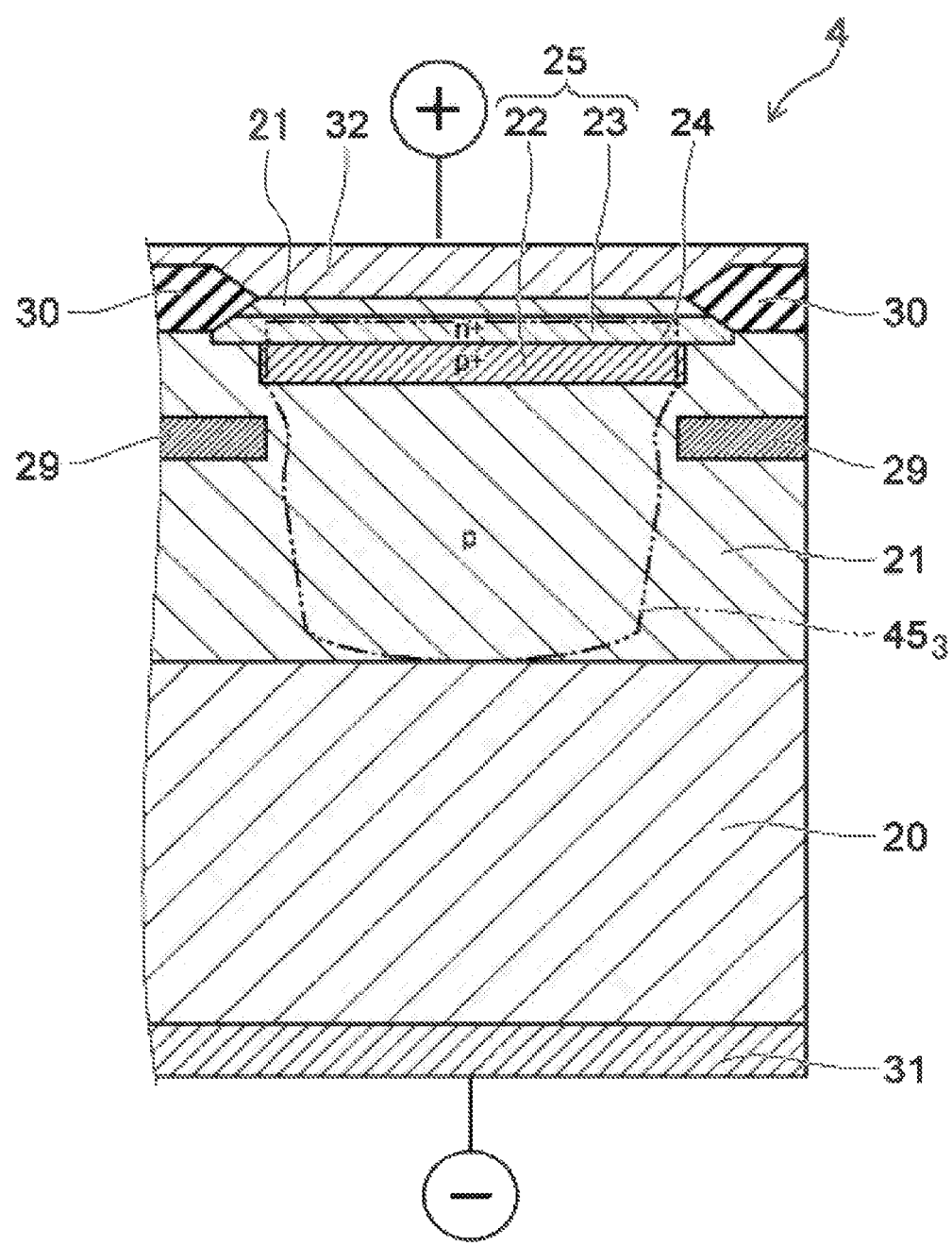
FIG. 12 is a cross-sectional view showing a photodetector according to a fourth embodiment.

FIG. 12 is a cross-sectional view showing a photodetector according to a fourth embodiment.

As shown in FIG. 12, a photodetector 4 according to the fourth embodiment is different from the photodetector 1 (see FIG. 3) according to the first embodiment described above in that instead of the peripheral p+ type layer 26, a peripheral conductive layer 29 is provided. The peripheral conductive layer 29 is formed of a conductive material, for example metal materials such as aluminum (Al), and a shape thereof when viewed from above is the same as that of the LOCOS film 30 or a lattice shape which is thicker than the LOCOS film 30. In addition, the peripheral conductive layer 29 is disposed under the LOCOS film 30 and a p+ type layer 22, and thus is separated from the LOCOS film 30 and the p+ type layer 22. The peripheral conductive layer 29 is at a floating electric potential.

In the fourth embodiment, an effective region $45_3$ can be enlarged by allowing the peripheral conductive layer 29 to attract lines of electric force in addition to allowing the peripheral conductive layer 29 to prevent electrons from moving and prevent a depletion layer 40 (see FIG. 5) from extending. As a result, the photon detection efficiency of the photodetector 4 can be improved.

Configurations, operations and effects other than those described above in the fourth embodiment are the same as those in the first embodiment.

Fifth Embodiment

Next, a fifth embodiment will be described.

Figure 13:
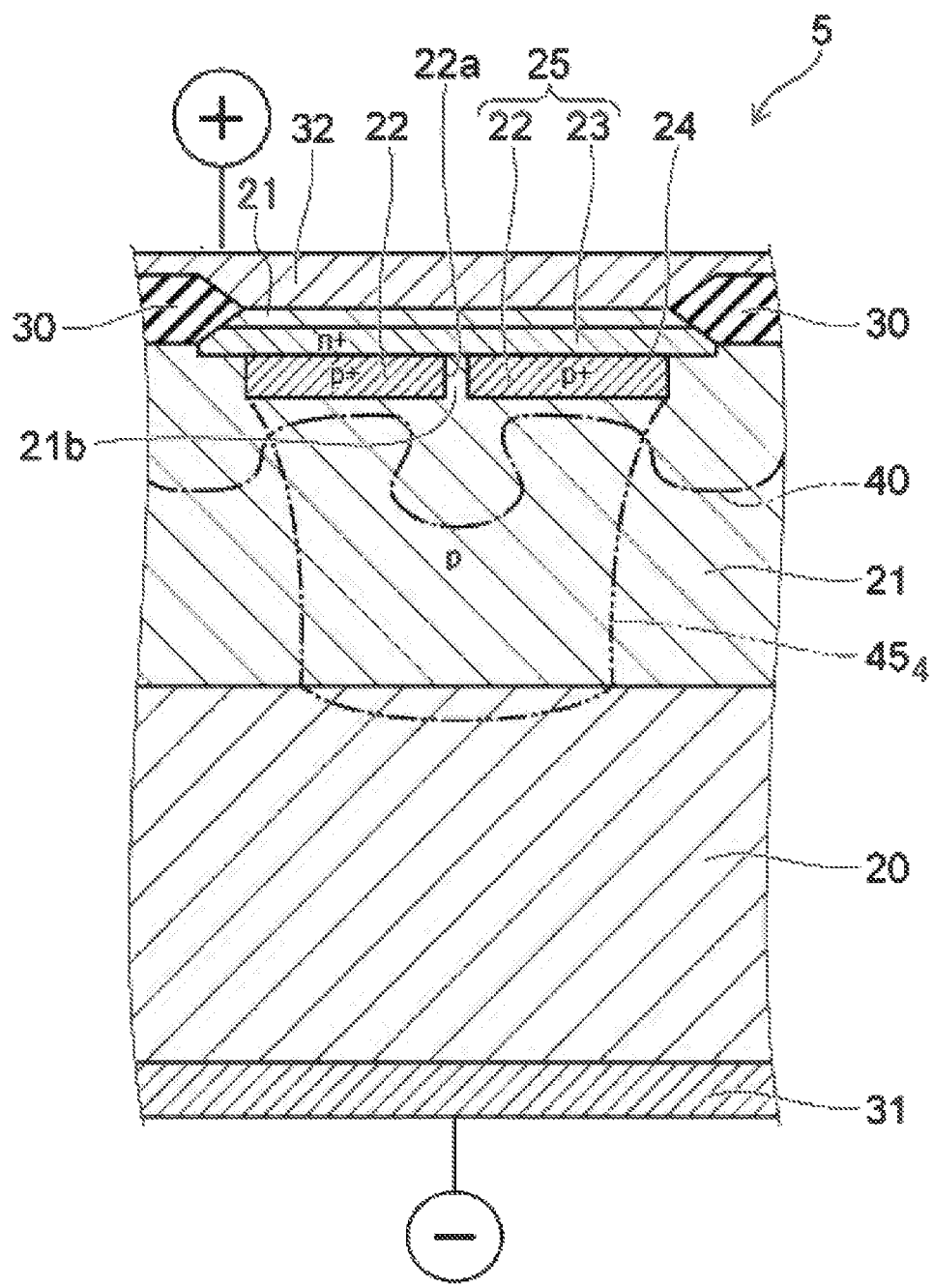
FIG. 13 is a cross-sectional view showing a photodetector according to a fifth embodiment.

FIG. 13 is a cross-sectional view showing a photodetector according to a fifth embodiment.

As shown in FIG. 13, a photodetector 5 according to a fifth embodiment is different from the photodetector 1 (see FIG. 3) according to the first embodiment described above in that the peripheral p+ type layer 26 is not provided, and when viewed from above, a central part of a p+ type layer 22 is provided with a hole 22a. The hole 22a penetrates the p+ type layer 22 in a vertical direction. A portion 21b of an epitaxial layer 21 extends into the hole 22a. Since impurities are diffused from the p+ type layer 22 into the portion 21b, an impurity concentration of the portion 21b is higher than an average impurity concentration of the epitaxial layer 21, but lower than the impurity concentration of the p+ type layer 22.

In the fifth embodiment, by forming the hole 22a in the central part of the p+ type layer 22, the depletion layer 40 can more greatly extend downward in a central part of an SiPM element 11. As a result, electrons more easily reach a pn boundary 24 via the depletion layer 40. As a result, the photon detection efficiency is improved.

Configurations, operations and effects other than those described above in the fifth embodiment are the same as those in the first embodiment.

It is noted that the above-described effects can be obtained to some extent merely by lowering the impurity concentration slightly in the vicinity of the central part of the p+ type layer 22 without forming the hole 22a in the p+ type layer 22.

In addition, the fifth embodiment may be implemented in combination with each of the embodiments described above. For example, while the hole 22a is formed in the p+ type layer 22, the peripheral p+ type layer 26 (see FIGS. 3 and 8) may be provided as in the first embodiment or the modification thereof, the peripheral insulating layer 27 (see FIG. 10) may be provided as in the second embodiment, the peripheral insulating member 29 (see FIG. 11) may be provided as in the third embodiment, or the peripheral conductive layer 29 (see FIG. 12) may be provided as in the fourth embodiment.

Further, in each of the embodiments described above, the conductivity types of each portion may be reversed. In this case, holes become carriers causing avalanche breakdown. However, it is more efficient to use electrons as carriers.

According to the above-described embodiments, it is possible to realize a photodetector having a higher photon detection efficiency. In addition, it is possible to more accurately identify shapes of or distances from faraway targets by the light detection and ranging configured to include a laser oscillator that oscillates an infrared laser, a scanning optical system that scans an infrared laser, the photodetector described in each of the embodiments that detects the infrared light reflected from the target, a control circuit and the like.

While certain embodiments have been described, these embodiments have been presented by way of example only, and are not intended to limit the scope of the embodiments. Indeed, the novel embodiments described herein may be embodied in a variety of other forms; furthermore, various omissions, substitutions and changes in the form of the embodiments described herein may be made without departing from the spirit of the embodiments. The accompanying claims and their equivalents are intended to cover such forms or modifications as would fall within the scope and spirit of the embodiments.

What is claimed is:

1. A photodetector, comprising:
a silicon layer provided on a first main surface of a semiconductor substrate and of a first conductivity type;
a first semiconductor layer provided in the silicon layer, of a first conductivity type, and having an impurity concentration higher than an impurity concentration of the silicon layer;
a second semiconductor layer provided on the first semiconductor layer, of a second conductivity type, and forming a pn boundary with the first semiconductor layer;
a third semiconductor layer provided in the silicon layer, of a first conductivity type, having an impurity concentration higher than that of the silicon layer, and separated from the first semiconductor layer;
a first electrode provided under a second main surface of the semiconductor substrate, and electrically connected to the silicon layer; and
a second electrode provided above the second semiconductor layer, electrically connected to the second semiconductor layer, and not electrically connected to the third semiconductor layer,
wherein the silicon layer, the first semiconductor layer, the second semiconductor layer, the third semiconductor layer, the first electrode and the second electrode constitute a silicon photomultiplier (SiPM) element, and
the silicon photomultiplier (SiPM) element produces an electric field by the voltage applied between the first electrode and the second electrode.

2. The photodetector according to claim 1, wherein the third semiconductor layer is located under the first semiconductor layer in a direction perpendicular to a boundary surface of the pn boundary.

3. The photodetector according to claim 2, wherein a part of the third semiconductor layer overlaps with a part of the first semiconductor layer when viewed in a plan view in a direction perpendicular to the boundary surface of the pn boundary.

4. The photodetector according to claim 3, wherein an effective region capable of capturing photons is generated and diffused under the third semiconductor layer by applying the voltage between the first electrode and the second electrode.

5. The photodetector according to claim 2, wherein an effective region capable of capturing photons is generated and diffused under the third semiconductor layer by applying the voltage between the first electrode and the second electrode.

6. The photodetector according to claim 1, wherein a part of the third semiconductor layer overlaps with a part of the first semiconductor layer in a direction perpendicular to a boundary surface of the pn boundary.

7. The photodetector according to claim 6, wherein an effective region capable of capturing photons is generated and diffused under the third semiconductor layer by applying the voltage between the first electrode and the second electrode.

8. The photodetector according to claim 1, wherein the third semiconductor layer surrounds the first semiconductor layer when viewed in a plan view in a direction perpendicular to the boundary surface of the pn boundary.

9. The photodetector according to claim 8, wherein an effective region capable of capturing photons is generated and diffused under the third semiconductor layer by applying the voltage between the first electrode and the second electrode.

10. The photodetector according to claim 1, wherein the impurity concentration of the third semiconductor layer is at least 10 times higher than the impurity concentration of the silicon layer.

11. The photodetector according to claim 10, wherein an effective region capable of capturing photons is generated and diffused under the third semiconductor layer by applying the voltage between the first electrode and the second electrode.

12. A light detection and ranging device, in which a laser oscillator oscillates an infrared laser and a scanner scans the infrared laser and irradiates the photodetector with the scanned infrared laser, comprising:
the photodetector according to claim 1.

13. The photodetector according to claim 1, wherein an effective region capable of capturing photons is generated and diffused under the third semiconductor layer by applying the voltage between the first electrode and the second electrode.

* * * * *